(12) United States Patent
Hsieh et al.

(10) Patent No.: US 10,121,834 B2
(45) Date of Patent: Nov. 6, 2018

(54) FLEXIBLE BASE SUBSTRATE, DISPLAY SUBSTRATE AND METHODS OF MANUFACTURING THE SAME, AND DISPLAY DEVICE

(71) Applicant: BOE TECHNOLOGY GROUP CO., LTD., Beijing (CN)

(72) Inventors: Mingche Hsieh, Beijing (CN); Chunyan Xie, Beijing (CN); Lu Liu, Beijing (CN); Hejin Wang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/511,656

(22) PCT Filed: Mar. 1, 2016

(86) PCT No.: PCT/CN2016/075103
§ 371 (c)(1),
(2) Date: Mar. 16, 2017

(87) PCT Pub. No.: WO2016/150276
PCT Pub. Date: Sep. 29, 2016

(65) Prior Publication Data
US 2018/0233545 A1    Aug. 16, 2018

(30) Foreign Application Priority Data

Mar. 26, 2015   (CN) .......................... 2015 1 0134975

(51) Int. Cl.
*H01L 51/52*   (2006.01)
*H01L 27/32*   (2006.01)
(Continued)

(52) U.S. Cl.
CPC ...... *H01L 27/3244* (2013.01); *H01L 51/0097* (2013.01); *H01L 51/56* (2013.01)

(58) Field of Classification Search
None
See application file for complete search history.

(56) References Cited

U.S. PATENT DOCUMENTS

2011/0108809 A1   5/2011   Seo et al.
2013/0076268 A1   3/2013   Choi et al.
(Continued)

FOREIGN PATENT DOCUMENTS

CN   1578546 A    2/2005
CN   203643711 U  6/2014
(Continued)

OTHER PUBLICATIONS

International Search Report and Written Opinion for Application No. PCT/CN2016/075103, dated Jun. 12, 2016, 13 Pages.
(Continued)

*Primary Examiner* — Michael Lebentritt
(74) *Attorney, Agent, or Firm* — Brooks Kushman P.C.

(57) ABSTRACT

The present disclosure discloses a flexible base substrate, a display substrate and methods of manufacturing the same, and a display device. A groove is provided in a surface of the flexible base substrate, the surface of the flexible base substrate having the groove is provided with a water-oxygen barrier film, and the thickness of the water-oxygen barrier film is smaller than the depth of the groove.

11 Claims, 3 Drawing Sheets

(51) Int. Cl.
*H01L 51/56* (2006.01)
*H01L 51/00* (2006.01)

(56) References Cited

U.S. PATENT DOCUMENTS

| | | | |
|---|---|---|---|
| 2014/0054803 A1* | 2/2014 | Chen | H01L 23/3135 257/790 |
| 2014/0198435 A1 | 7/2014 | Yeh et al. | |
| 2014/0204291 A1* | 7/2014 | Kung | G06F 3/041 349/12 |
| 2014/0346473 A1 | 11/2014 | Park et al. | |
| 2015/0000734 A1 | 1/2015 | Lee | |
| 2015/0357589 A1* | 12/2015 | Zhu | H01L 51/0097 428/161 |
| 2016/0164028 A1* | 6/2016 | Sakakura | H01L 51/5237 257/40 |
| 2016/0254464 A1* | 9/2016 | Hsieh | G09F 9/33 428/192 |
| 2017/0077406 A1* | 3/2017 | Xie | H01L 27/3244 |
| 2017/0092895 A1* | 3/2017 | Hsieh | H01L 51/5253 |
| 2017/0155082 A1* | 6/2017 | Mu | H01L 51/5253 |
| 2017/0155083 A1* | 6/2017 | Luo | H01L 51/5253 |
| 2018/0033999 A1* | 2/2018 | Zhai | H01L 51/5253 |

FOREIGN PATENT DOCUMENTS

| | | |
|---|---|---|
| CN | 103988319 A | 8/2014 |
| CN | 103996629 A | 8/2014 |
| CN | 104183783 A | 12/2014 |
| CN | 104795424 A | 7/2015 |

OTHER PUBLICATIONS

First Office Action for Chinese Application No. 201510134975.8, dated Apr. 12, 2017, 7 Pages.

* cited by examiner

FLEXIBLE BASE SUBSTRATE, DISPLAY SUBSTRATE AND METHODS OF MANUFACTURING THE SAME, AND DISPLAY DEVICE

CROSS-REFERENCE TO RELATED APPLICATION APPLICATIONS

This application is the U.S. national phase of PCT Application No. PCT/CN2016/075103 filed on Mar. 1, 2016, which claims priority to Chinese Patent Application No. 201510134975.8 filed on Mar. 26, 2015, the disclosures of which are incorporated in their entirety by reference herein.

TECHNICAL FIELD

The present disclosure relates to the field of display technology, in particular to a flexible base substrate, a display substrate and methods of manufacturing the same, and a display device.

BACKGROUND

Conventional displays are flat panel displays, and cannot be bent arbitrarily. A development trend of displays is to display lots of information on a flexible body, i.e. a flexible display. The flexible display and flexible display module can be mechanically bent in any of the steps such as substrate packaging, production, storage, use, operation, process connection, handling, and transportation. The key technologies for achieving the flexible display include: display technology, substrate technology, array technology and encapsulation technology. At present, the substrate that can be used in the flexible display mainly includes: ultrathin glass substrate, metal foil substrate and plastic substrate. Plastic substrates (generally, PEN, PET, PI, PC and the like are used) have better flexibility, lighter weight, higher impact resistance, and are suitable for manufacturing thinner devices, thus becoming the development trend of flexible display technology.

However, plastic is an organic material, and water vapor and oxygen may easily penetrate the plastic and thus affect the quality of flexible display panels, especially the performances of OLEDs, TFTs. Even if a barrier layer is attached on a back side, water vapor/oxygen will also enter from an edge side to affect the quality of the product.

SUMMARY

The present disclosure provides a flexible base substrate, a display substrate and methods of manufacturing the same, so as to prevent the quality of the product from being affected since the flexible organic material base substrate cannot block water vapor and oxygen.

The present disclosure provides in some embodiments a display device which includes the above-mentioned display substrate to ensure the quality of the product.

To solve the above-mentioned technical problem, the embodiments of the present disclosure provide a flexible base substrate, which includes an organic material base film. A groove is provided in a surface of the organic material base film, the surface of the organic material base film having the groove is provided with a water-oxygen barrier film, and a thickness of the water-oxygen barrier film is smaller than a depth of the groove.

Optionally, in the above-mentioned flexible base substrate, the groove is filled with an organic material filling film in such a manner that the surface of the flexible base substrate is planarized, and the organic material filling film is arranged on the water-oxygen barrier film.

Optionally, the organic material base film and the organic material filling film are made of plastic or resin.

The embodiments of the present disclosure further provide a method of manufacturing the above-mentioned flexible base substrate, which includes: forming a groove in a surface of an organic material base film; forming a water-oxygen barrier film on the surface of the organic material base film having the groove, the thickness of the water-oxygen barrier film being smaller than the depth of the groove.

Optionally, the above-mentioned method further includes: forming an organic material filling film on the water-oxygen barrier film and filling the groove with the organic material filling film to planarize the surface of the flexible base substrate.

Optionally, in the above-mentioned method, the flexible base substrate is formed through the following steps: providing an inorganic substrate; forming the organic material base film on a surface of the inorganic substrate; forming the groove in the surface of the organic material base film; forming the water-oxygen barrier film on the surface of the organic material base film having the groove; and peeling off the inorganic substrate.

The embodiments of the present disclosure further provide a display substrate, which includes a flexible base substrate and a display film layer arranged on the flexible base substrate. The flexible base substrate includes an organic material base film, a groove is provided in a surface of the organic material base film, the surface of the organic material base film having the groove is provided with a water-oxygen barrier film, and a thickness of the water-oxygen barrier film is smaller than a depth of the groove. The display film layer is arranged on the water-oxygen barrier film, and at least part of the display film layer is located in an area where the groove is located.

Optionally, in the above-mentioned display substrate, the groove is filled with an organic material filling film so as to planarize the surface of the flexible base substrate, and the organic material filling film is arranged on the water-oxygen barrier film. The display film layer is arranged on the organic material filling film.

Optionally, in the above-mentioned display substrate, the display film layer is entirely located in the area where the groove is located.

Optionally, in the above-mentioned display substrate, the display film layer includes an organic light emitting layer of an organic light emitting diode or an active layer of a thin film transistor, and the active layer is made of a silicon semiconductor material.

The embodiments of the present disclosure further provide a method of manufacturing the above-mentioned display substrate, which includes: forming a flexible base substrate; and forming a display film layer on the flexible base substrate. The method further includes: forming a groove in a surface of an organic material base film; forming a water-oxygen barrier film on the surface of the organic material base film having the groove, a thickness of the water-oxygen barrier film being smaller than a depth of the groove; and forming the display film layer on the water-oxygen barrier film, at least part of the display film layer being located in an area where the groove is located.

Optionally, the above-mentioned method further includes: forming an organic material filling film on the water-oxygen barrier film, and filling the groove with the organic material filling film to planarize the surface of the flexible base substrate; forming the display film layer on the organic material filling film.

Optionally, in the above-mentioned method, the step of forming the flexible base substrate includes: providing an inorganic substrate; forming the organic material base film on a surface of the inorganic substrate; forming the groove in the surface of the organic material base film; and peeling off the inorganic substrate subsequent to forming the display film layer.

Optionally, the embodiments of the present disclosure further provides display device, which includes the above-mentioned display substrate.

The present disclosure has the following beneficial effects.

In the above-mentioned technical solutions, the groove is provided in the surface of the flexible base substrate, the surface of the flexible base substrate having the groove is provided with a water-oxygen barrier film, and the thickness of the water-oxygen barrier film is smaller than the depth of the groove. As a result, when display elements are formed on the water-oxygen barrier film, the water-oxygen barrier film in the groove may prevent water vapor and oxygen from entering the display film layer from the side and the back of the base substrate and thus from affecting the performance of the display elements, thereby improving the stability of the product and ensuring the quality of the display device.

BRIEF DESCRIPTION OF THE DRAWINGS

In order to more clearly illustrate the embodiments of the present disclosure or the technical solutions in the related art, drawings which are required to be used in the description of the embodiments or related art will be briefly described below. Apparently, the drawings in the following description relate to only some embodiments of the present disclosure. It will be apparent to a person of ordinary skills in the art that other drawings may be derived from the drawings without any creative work.

DETAILED DESCRIPTION

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position rela-tionship, and when an absolute position of an object is changed, the relative position relationship will be changed too.

The present disclosure provides a flexible base substrate and a method of manufacturing the same, in particular the flexible base substrate made of organic materials (such as plastic, resin), so as to solve the problem that water vapor and oxygen may penetrate the flexible base substrate made of organic materials and thus affect the performance of the display elements thereon, in particular organic light emitting diodes, thin film transistors, etc.

A groove is provided in a surface of the flexible base substrate, the surface of the flexible base substrate with the groove is provided with a water-oxygen barrier film, and the thickness of the water-oxygen barrier film is smaller than the depth of the groove. As a result, when display elements are formed on the water-oxygen barrier film, the water-oxygen barrier film in the groove may prevent water vapor and oxygen from entering the display elements from the side and back of the base substrate and thus from affecting the performance of the display elements, thereby ensuring the quality of the display device.

Accordingly, the method of manufacturing the flexible base substrate includes: forming a groove in a surface of an organic material base film; forming a water-oxygen barrier film on the surface of the organic material base film having the groove, the thickness of the water-oxygen barrier film being smaller than the depth of the groove.

The water-oxygen barrier film may be made of inorganic material, since the inorganic material has the characteristic of blocking water vapor and oxygen.

The present disclosure will be specifically described in conjunction with accompanying drawings and embodiments. The following embodiments are merely illustrative of the present disclosure and are not intended to limit the scope of the present disclosure.

Figure 2:
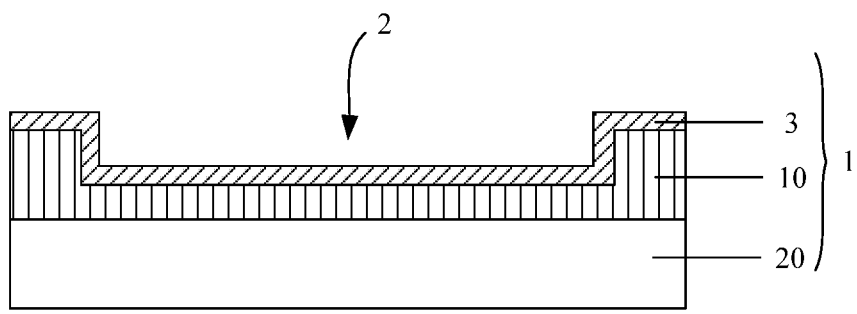

As shown in FIG. 2, an embodiment of the present disclosure provides a flexible base substrate 1. The flexible base substrate 1 includes an organic material base film 10, and a groove 2 is provided in a surface of the organic material base film 10. The surface of the organic material base film 10 having the groove 2 is provided with a water-oxygen barrier film 3. The thickness of the water-oxygen barrier film 3 is smaller than the depth of the groove 2. Therefore, the water-oxygen barrier film 3 can prevent water vapor and oxygen from entering the groove 2 from the bottom and the side of the groove 2. When there are organic elements formed on the water-oxygen barrier film 3, the organic elements in the groove 2 may be protected from being affected by water vapor and oxygen, thereby ensuring the quality of the elements.

The water-oxygen barrier film 3 may be made of inorganic material, since the inorganic material has the characteristic of blocking water vapor and oxygen.

Figure 1:
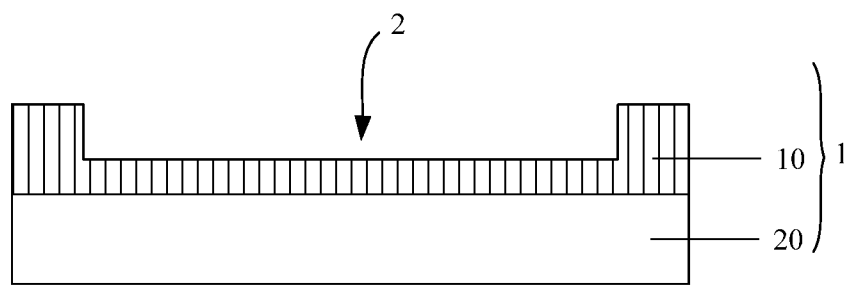
FIGS. 1-2 illustrate schematic diagrams of a manufacturing process of a flexible base substrate of some embodiments of the present disclosure.

Accordingly, as shown in FIGS. 1 and 2, the embodiments of the present disclosure also provide a method of manufacturing a flexible base substrate, which includes: forming the groove 2 in the surface of the organic material base film 10; forming the water-oxygen barrier film 3 on the surface of the organic material base film 10 having the groove 2, the thickness of the water-oxygen barrier film 3 being smaller than the depth of the groove 2.

In the technical solutions of the present disclosure, water vapor and oxygen may be prevented from entering the organic elements formed on the base substrate from the back side and the edge side of the base substrate, thereby ensuring the quality of the elements and improving the stability of the product.

In practical processes, the flexible base substrate 1 may be formed through the following steps: providing an inorganic substrate 20, such as a glass substrate; forming the organic material base film 10 that may be made of plastic or resin on the surface of the inorganic substrate 20; forming the groove 2 in the surface of the organic material base film 10; forming the water-oxygen barrier film 3 on the surface of the organic material base film 10 having the groove 2, the thickness of the water-oxygen barrier film 3 being smaller than the depth of the groove 2; and peeling off the inorganic substrate 20.

The flexible base substrate 1 includes the organic material base film 10 arranged on the surface of the inorganic substrate 20, and the groove 2 is provided in the surface of the organic material base film 10. The inorganic substrate 20 may be peeled off in an appropriate step as required in subsequent applications, and ultimately the flexible base substrate 1 does not include the inorganic substrate 20.

Figure 6:
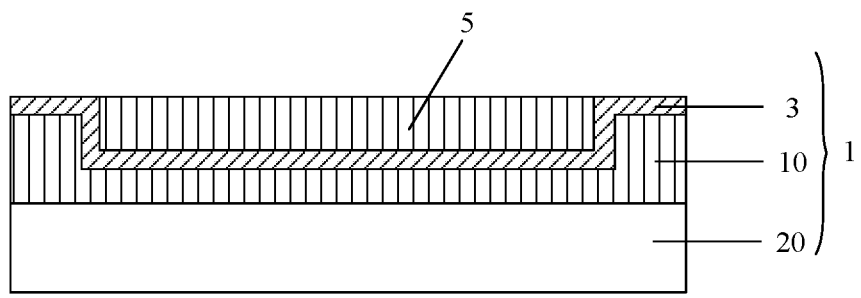
FIG. 6 illustrates a schematic diagram of a flexible base substrate of some embodiments of the present disclosure.

Optionally, the groove 2 is filled with an organic material filling film 5 and the organic material filling film 5 is arranged on the water-oxygen barrier film 3, as shown in FIG. 6. By filling the groove 2 with the organic material filling film 5, it is possible to planarize the surface of the flexible base substrate, which is in favor of the uniformity of subsequent processes.

The organic material filling film 5 may be made of plastic or resin.

Accordingly, the method of manufacturing the flexible base substrate includes: forming the organic material filling film 5 on the water-oxygen barrier film 3 so that the organic material filling film 5 is arranged in the groove 2 to planarize the surface of the flexible base substrate.

As shown in FIG. 6, the flexible base substrate according to an embodiment of the present disclosure may specifically includes: the organic material base film 10; the groove 2 arranged in the surface of the organic material base film 10; the water-oxygen barrier film 3 arranged on the surface of the organic material base film 10 having the groove 2, the thickness of the water-oxygen barrier film 3 being smaller than the depth of the groove 2; the organic material filling film 5 located on the water-oxygen barrier film 3 and arranged in the groove 2, thereby planarizing the surface of the flexible base substrate.

Optionally, the organic material filling film 5 and the organic material base film 10 are made of the same material.

Figure 4:
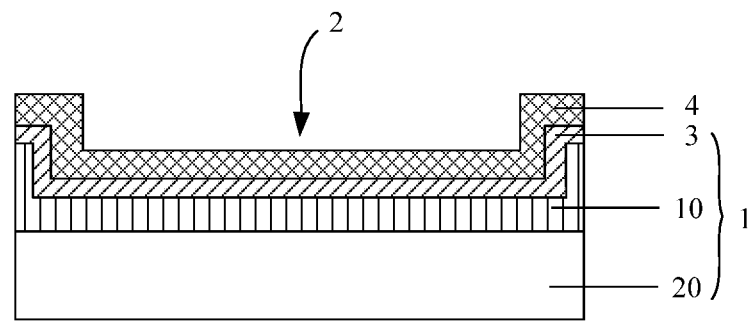

Base on the same inventive concept, the embodiments of the present disclosure also provide a display substrate as shown in FIG. 4, which includes a flexible base substrate 1 and a display film layer 4 arranged on the flexible base substrate 1. The flexible base substrate 1 includes the organic material base film 10. The groove 2 is provided in the surface of the organic material base film 10. The water-oxygen barrier film 3 is arranged on the surface of the substrate organic material 10 having the groove 2 and the thickness of the water-oxygen barrier film 3 is smaller than the depth of the groove 2. The display film layer 4 is arranged on the water-oxygen barrier film 3, and at least part of the display film layer 4 is located in the area where the groove 2 is located.

Specifically, at least part of the display film layer 4 is arranged in the groove 2.

In the above-mentioned technical solution, since the thickness of the water-oxygen barrier film 3 is smaller than the depth of the groove 2 and the water-oxygen barrier film 3 may prevent water vapor and oxygen from entering the groove 2 from the bottom and the side of the groove 2, the display film layer 4 located in the groove 2 may be protected from being affected by water vapor and oxygen, thereby improving the stability of the display elements and ensuring the quality of the product.

Figure 3:
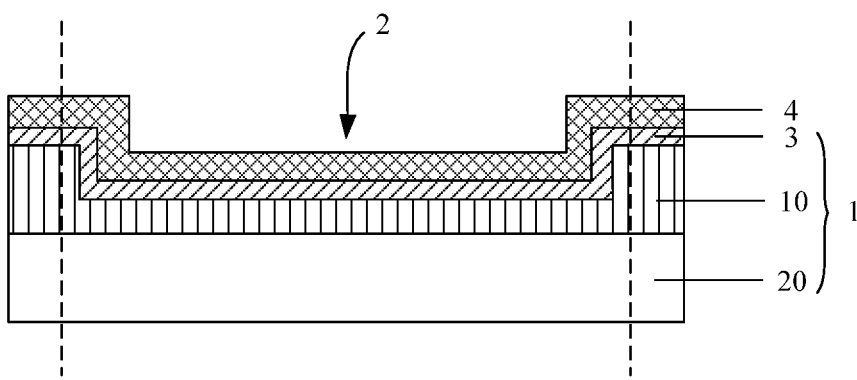
FIGS. 3-5 illustrate schematic diagrams of a manufacturing process of a display substrate of some embodiments of the present disclosure.

Accordingly, as shown in FIGS. 1-3, the embodiments of the present disclosure also provide a method of manufacturing a display substrate, which includes: forming the organic material base film 10; forming the groove 2 in the surface of the organic material base film 10; forming the water-oxygen barrier film 3 on the surface of the organic material base film 10 having the groove 2, the thickness of the water-oxygen barrier film 3 being smaller than the depth of the groove 2; forming the display film layer 4 on the water-oxygen barrier film 3, at least part of the display film layer 4 located in the area where the groove 2 is located.

Optionally, the entire display film layer 4 is located in the area where the groove 2 is located, and the water-oxygen barrier film 3 cooperates with the groove 2 to protect the whole display film layer 4 from being affected by water vapor and oxygen.

Figure 5:
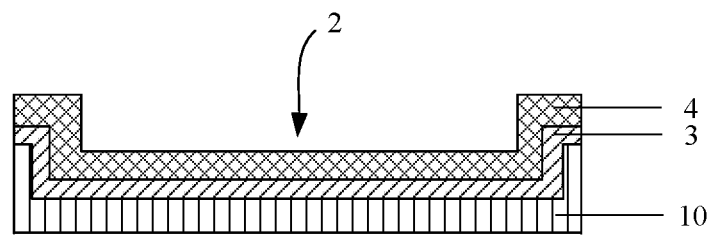

In order to improve the quality of the display substrate, the method further includes: removing portions of the display substrate at a region around the groove 2 along the dotted lines in FIG. 3 so that the display film layer 4 is substantially protected by the cooperation of the groove 2 and the water-oxygen barrier film 3 from being affected by water vapor and oxygen, as shown in FIGS. 3 and 4; and peeling off the inorganic substrate 20, as shown in FIG. 5.

Figure 7:
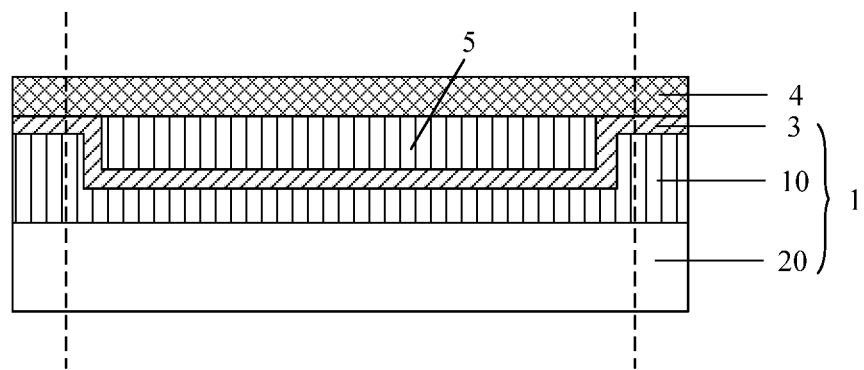
FIGS. 7-9 illustrate schematic diagrams of a manufacturing process of a display substrate of some embodiments of the present disclosure.
Figure 8:
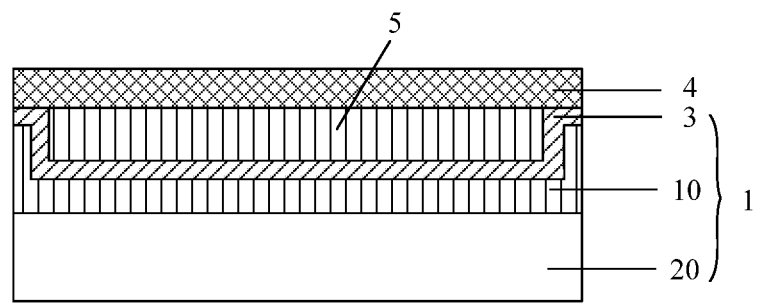
Figure 9:
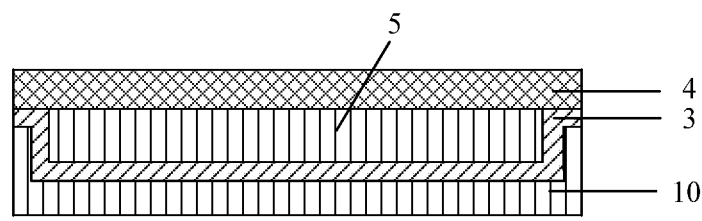

In the embodiments of the present disclosure, the groove 2 is filled with the organic material filling film 5 and the organic material filling film 5 is arranged on the water-oxygen barrier film 3 to provide a surface-planarized flexible base substrate, as shown in FIG. 6. Then, the display film layer 4 is arranged on the organic material filling film 5, thereby improving the uniformity of the formed film, as shown in FIG. 7.

For an organic light emitting diode display substrate, the display film layer 4 includes an organic light emitting layer of organic light emitting diodes.

For a thin film transistor display substrate, the display film layer 4 includes an active of thin film transistors, in particular when the active layer is made of organosilicon semiconductor material.

In practical processes, the flexible base substrate 1 may be formed through the following steps: providing the inorganic substrate 20, such as a glass substrate; forming the organic material base film 10 that may be made of plastic or resin on the surface of the inorganic substrate 20; forming the groove 2 in the surface of the organic material base film 10; and peeling off the inorganic substrate 20 after the display film layer 4 is formed on the organic material base film 10.

As shown in FIG. 1, FIG. 2 and FIGS. 6-9, the method of manufacturing a display substrate of the embodiments of the present disclosure specifically includes: providing the inorganic substrate 20; forming the organic material base film 10 on the surface of the inorganic substrate 20; forming the groove 2 in the surface of the organic material base film 10; forming the water-oxygen barrier film 3 on the surface of the organic material base film 10 having the groove 2, the thickness of the water-oxygen barrier film 3 being smaller than the depth of the groove 2; forming the organic material filling film 5 on the water-oxygen barrier film 3 so that the organic material filling film 5 is arranged in the groove 2 to planarize the surface of the flexible base substrate; forming the display film layer 4 on the organic material filling film 5, the display film layer 4 being located in the area where the groove 2 is located and including the layers of organic light emitting diodes or the layers of thin film transistors; removing portions of the display substrate at a region around the groove 2 along the dotted lines in FIG. 7 so that the display film layer 4 is substantially protected by the cooperation of the groove 2 and the water-oxygen barrier film 3 from being affected by water vapor and oxygen; and peeling off the inorganic substrate 20.

Thus, the manufacture of the display substrate is completed.

It should be noted that the display substrate of the embodiments of the present disclosure may be an organic light emitting diode display substrate or a thin film transistor display substrate as an example, but the present disclosure is not intended to be limited thereto. The display film layer 4 may also be a film layer of other organic elements, depending on the type of the display substrate.

The embodiments of the present disclosure also provide a display device, which includes the display substrate of the embodiments of the present disclosure so that the stability of the product is improved and the quality of the product is ensured.

In the technical solutions of the present disclosure, a groove is provided in a surface of the flexible base substrate, the surface of the flexible base substrate having the groove is provided with a water-oxygen barrier film, and the thickness of the water-oxygen barrier film is smaller than the depth of the groove. As a result, when display elements are formed on the water-oxygen barrier film, the water-oxygen barrier film in the groove may prevent water vapor and oxygen from entering the display film layer from the edge side and the back side of the base substrate and thus from affecting the performance of the display elements, thereby improving the stability of the product and ensuring the quality of the display device.

The above-mentioned embodiments are merely optional embodiments of the present disclosure. It should be noted that improvements and modifications may be made by those skilled in the art without departing from the technical principles of the present disclosure. These improvements and modifications should also be considered within the scope of protection of the present disclosure.

What is claimed is:

1. A display substrate, comprising a flexible base substrate and a display film layer arranged on the flexible base substrate, wherein
the flexible base substrate comprises an organic material base film, a groove is provided in a surface of the organic material base film, the surface of the organic material base film having the groove is provided with a water-oxygen barrier film, and a thickness of the water-oxygen barrier film is smaller than a depth of the groove; and
the display film layer is arranged on the water-oxygen barrier film, and at least part of the display film layer is located in an area where the groove is located.

2. The display substrate according to claim 1, wherein the groove is filled with an organic material filling film to planarize the surface of the flexible base substrate, the organic material filling film is arranged on the water-oxygen barrier film, and
the display film layer is arranged on the organic material filling film.

3. The display substrate according to claim 1, wherein the entire display film layer is located in the area where the groove is located.

4. The display substrate according to claim 1, wherein the display film layer comprises an organic light emitting layer of an organic light emitting diode or an active layer of a thin film transistor, and the active layer is made of a silicon semiconductor material.

5. A method of manufacturing the display substrate according to claim 1, comprising:
forming a flexible base substrate; and
forming a display film layer on the flexible base substrate;
wherein, the method further comprises:
forming a groove in a surface of an organic material base film;
forming a water-oxygen barrier film on the surface of the organic material base film having the groove, a thickness of the water-oxygen barrier film being smaller than a depth of the groove; and
forming the display film layer on the water-oxygen barrier film, at least part of the display film layer being located in an area where the groove is located.

6. The method according to claim 4, further comprising:
forming an organic material filling film on the water-oxygen barrier film, and filling the groove with the organic material filling film to planarize the surface of the flexible base substrate; and
forming the display film layer on the organic material filling film.

7. The method according to claim 5, wherein the forming a flexible base substrate comprises:
providing an inorganic substrate;
forming the organic material base film on a surface of the inorganic substrate;
forming the groove in the surface of the organic material base film; and
peeling off the inorganic substrate subsequent to forming the display film layer.

8. A display device, comprising the display substrate of claim 1.

9. The display device according to claim 8, wherein the groove is filled with an organic material filling film to planarize the surface of the flexible base substrate, the organic material filling film is arranged on the water-oxygen barrier film, and
the display film layer is arranged on the organic material filling film.

10. The display device according to claim 8, wherein the entire display film layer is located in the area where the groove is located.

11. The display device according to claim 8, wherein the display film layer comprises an organic light emitting layer of an organic light emitting diode or an active layer of a thin film transistor, and the active layer is made of a silicon semiconductor material.

* * * * *